(12) United States Patent
Bae (10) Patent No.: US 7,944,763 B2
(45) Date of Patent: May 17, 2011

(54) SEMICONDUCTOR MEMORY DEVICE FOR PREVENTING MAL-OPERATION INDUCED BY MISRECOGNIZING ADDRESSES/DATA AS COMMANDS AND OPERATING METHOD THEREOF

(75) Inventor: Ji-Hyae Bae, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 97 days.

(21) Appl. No.: 12/488,011

(22) Filed: Jun. 19, 2009

(65) Prior Publication Data

US 2010/0277994 A1 Nov. 4, 2010

(30) Foreign Application Priority Data

Apr. 30, 2009 (KR) .................. 10-2009-0038530

(51) Int. Cl.
*G11C 7/00* (2006.01)
(52) U.S. Cl. ...................... 365/198; 365/191
(58) Field of Classification Search .................. 365/191, 365/198
See application file for complete search history.

(56) References Cited

U.S. PATENT DOCUMENTS 7,490,192 B2 * 2/2009 Sugimoto et al. ............. 711/103
7,706,197 B2 * 4/2010 Nagai ........................... 365/200

FOREIGN PATENT DOCUMENTS

KR 1020010108751 12/2001
KR 1020060075612 7/2006

* cited by examiner

*Primary Examiner* — VanThu Nguyen
(74) *Attorney, Agent, or Firm* — IP & T Group LLP (57) ABSTRACT

A semiconductor memory device and an operating method thereof prevent the mal-operation of the semiconductor memory device induced by misrecognizing addresses or data as commands. The semiconductor memory device includes a plurality of input pads, a data information path, a command path, a transfer block configured to transmit signals coupled through the input pads to the data information path and the command path, a command decoding block configured to decode signals transmitted through the command path to verify an inputting of a command, and a transmission control block configured to generate a control signal for controlling the signal transmission from the transfer block to the command path according to the verified result of the command decoding block.

21 Claims, 7 Drawing Sheets

SEMICONDUCTOR MEMORY DEVICE FOR PREVENTING MAL-OPERATION INDUCED BY MISRECOGNIZING ADDRESSES/DATA AS COMMANDS AND OPERATING METHOD THEREOF

CROSS-REFERENCE TO RELATED APPLICATIONS

The present application claims priority of Korean Patent Application No. 10-2009-0038530, filed on Apr. 30, 2009, the disclosure of which is incorporated herein by reference in its entirety.

BACKGROUND OF THE INVENTION

The present invention relates to a semiconductor memory device, and more particularly, to technology of preventing errors occurring as commands are misrecognized in a semiconductor memory device.

A semiconductor memory device typically receives commands through input pads where data and addresses for designating locations of data are inputted.

Table 1 shows a command sequence of one, e.g., a NOR flash memory device, of semiconductor memory devices receiving commands through address pads ADDR and data pads DATA.

TABLE 1

| Command Definition | | cycle | 1st | 2nd | 3rd | 4th | 5th | 6th |
|---|---|---|---|---|---|---|---|---|
| Reset | ADDR | 1 | XXXH | | | | | |
| | DATA | | F0H | | | | | |
| Program | ADDR | 4 | 555H | 2AAH | 555H | PA | | |
| | DATA | | AAH | 55H | A0H | PD | | |
| Program Suspend | ADDR | 1 | XXXH | | | | | |
| | DATA | | B0H | | | | | |
| Program Resume | ADDR | 1 | XXXH | | | | | |
| | DATA | | 30H | | | | | |
| CFI Query | ADDR | 1 | X55H | | | | | |
| | DATA | | 98H | | | | | |
| Write to Buffer | ADDR | 3 | 555H | 2AAH | BA | BA | PA | WBL |
| | DATA | | AAH | 55H | 25H | WC | PD | PD |
| Program Buffer to GST | ADDR | 1 | BA | | | | | |
| | DATA | | 29H | | | | | |
| Write to Buffer Abort Reset | ADDR | 3 | 555H | 2AAH | XXXH | | | |
| | DATA | | AAH | 55H | F0H | | | |

Figure 1A:
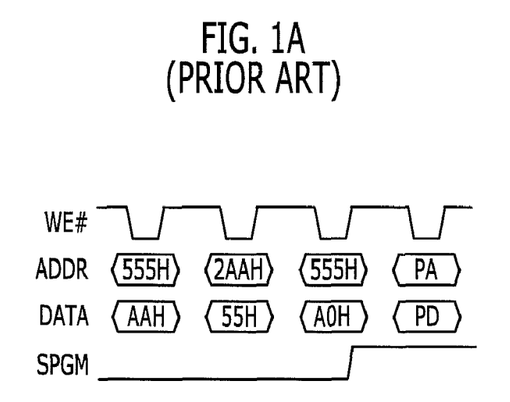
FIG. 1A is a timing diagram illustrating that a single program command defined in Table 1 is inputted to a memory device.
Figure 1B:
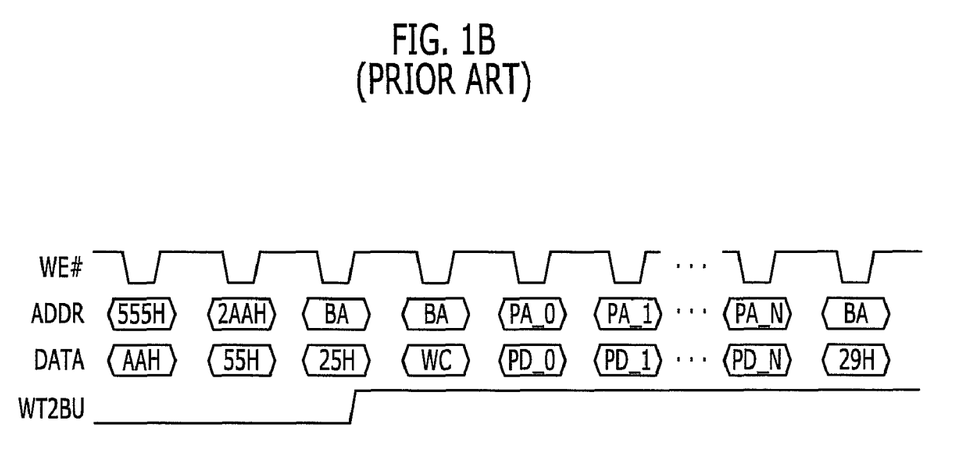
FIG. 1B is a timing diagram illustrating that a buffer program command defined in Table 1 is inputted to a memory device.

FIG. 1A is a timing diagram illustrating that a single program command (Program) defined in Table 1 is inputted to a memory device. FIG. 1B is a timing diagram illustrating that a buffer program command (Write to Buffer) defined in Table 1 is inputted to the memory device.

First of all, symbols in FIGS. 1A and 1B will be described hereinafter. ADDR represents a signal inputted through an address pad (pin); DATA represents a signal inputted through a data pad; and WE# represents a write enable signal enabled to a logic low to latch signals inputted through the address pad and the data pad. SPGM represents a signal enabled to a logic high when the memory device recognizes that the signal program command is inputted thereto by decoding signals inputted through the address pad and the data pad, and WT2BU represents a signal enabled to a logic high when the memory device recognizes that the buffer program command is inputted thereto by decoding signals inputted through the address pad and the data pad.

Referring to FIG. 1A, if 555H, 2AAH and 555H are inputted through the address pad ADDR for three cycles and AAH, 55H and A0H are inputted through the data pad DATA for three cycles, the memory device recognizes them as single program commands and enables the single program signal SPGM internally. Then, the memory device programs program data PD into a memory cell designated by program addresses PA that are subsequently inputted.

Referring to FIG. 1B, if 555H, 2AAH and BA are inputted through the address pad ADDR and AAH, 55H and 25H are inputted through the data pad DATA, the memory device recognizes them as buffer program commands and enables the buffer program signal WT2BU internally, wherein BA is a block address and represents a part of program addresses. When the buffer program signal WT2BU is enabled and the block address BA and a word count value WC are subsequently inputted for one cycle, the memory device receives program addresses PA_0 to PA_N and program data PD_0 to PD_N whose numbers correspond to the word count value WC. Herein, the number of program addresses/data is the number of WC+1 which is obtained by adding '1' to the word count value WC. The memory device programs the program data PD_0 to PD_N into memory cells designated by the program addresses PA_0 to PA_N.

Figure 2:
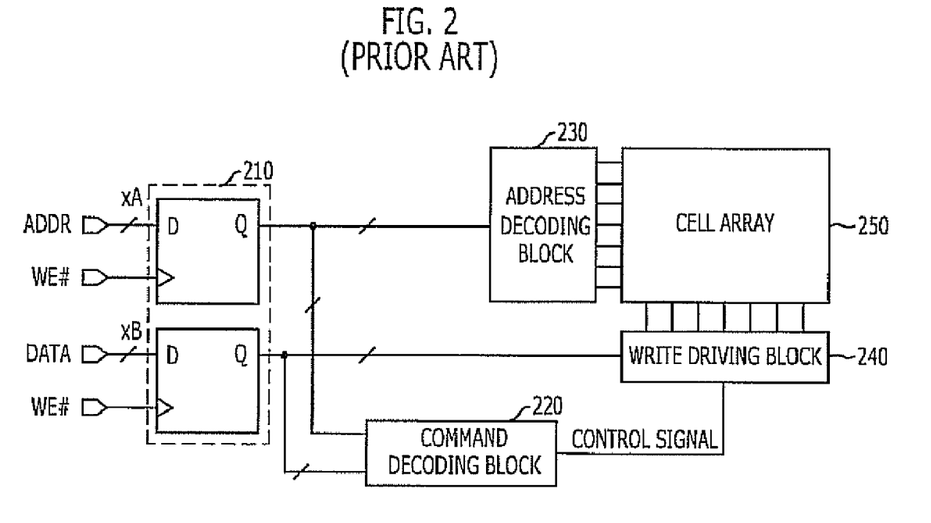
FIG. 2 illustrates a schematic block diagram of a conventional semiconductor memory device.

FIG. 2 illustrates a block diagram of a conventional semiconductor memory device.

Referring to FIG. 2, the semiconductor memory device includes a transfer block 210, a command decoding block 220, an address decoding block 230, a write driving block 240 and a cell array 250.

Signals inputted through a plurality of address pads ADDR, e.g., A numbers of address pads, and a plurality of data pads DATA, e.g., B numbers of data pads, responsive to a write enable signal WE#, are provided to the transfer block 210. The transfer block 210 transmits the signals inputted through the address pads ADDR to the address decoding block 230 so that the address decoding block 230 selects memory cells. The transfer block 210 transmits the signals inputted through the data pads DATA to the write driving block 240 so that the write driving block 240 writes data into the memory cells. Meanwhile, the transfer block 210 may transmit the signals inputted through the address pads ADDR and the data pads DATA to the command decoding block 220 as well.

The command decoding block 220 decodes the signals coupled from the transfer block 210 to judge which command is provided to the memory device, and generates a control signal CONTROL SIGNAL to control the write driving block 240 and circuits in a chip based on the judged results.

In the conventional semiconductor memory device, signals inputted through the address pads ADDR and the data pads DATA are continuously transferred to the command decoding block 220. Then, the command decoding block 220 judges whether or not commands are inputted to the memory device according to the command sequence described in Table 1. In such a construction, program addresses PA and program data PD may be misrecognized as commands. For instance, in a single program operation like that shown in FIG. 1A, if the program address PA of XXXH and the program data PD of B0H are inputted to the semiconductor memory device, the command decoding block 220 recognizes that a program suspend command (Program Suspend) is inputted and thus the single program operation is stopped.

That is, although addresses to designate a memory cell and data to be programmed in the designated memory cell are inputted, they may be misrecognized as commands and thus the malfunction of the semiconductor memory device may be induced.

SUMMARY OF THE INVENTION

An embodiment of the present invention is directed to providing a semiconductor memory device and an operating method thereof, which prevent the mal-operation of the semiconductor memory device induced by misrecognizing addresses or data as commands.

In accordance with an aspect of the present invention, there is provided a semiconductor memory device including a plurality of input pads, a data information path, a command path, a transfer block configured to transmit signals coupled through the input pads to the data information path and the command path, a command decoding block configured to decode signals transmitted through the command path to verify an inputting of a command, and a transmission control block configured to generate a control single for controlling the signal transmission from the transfer block to the command path according to the verified result of the command decoding block.

The transmission control block may hold the signal transmission from the transfer block to the command path during a period where data information corresponding to the command is inputted if the inputting of the command is verified by the command decoding block.

The data information path may include only an address path, only a data path, or both of the address path and the data path.

In accordance with another aspect of the present invention, there is provided an operating method of a semiconductor memory device including a plurality of input pads through which commands and data information are inputted, the method including recognizing a command by decoding signals inputted through the input pads, defining an input period of data information corresponding to the recognized command, and preventing signals inputted through the input pads from being recognized as commands during the defined input period.

DESCRIPTION OF SPECIFIC EMBODIMENTS

Other objects and advantages of the present invention can be understood by the following description, and become apparent with reference to the embodiments of the present invention.

Figure 3:
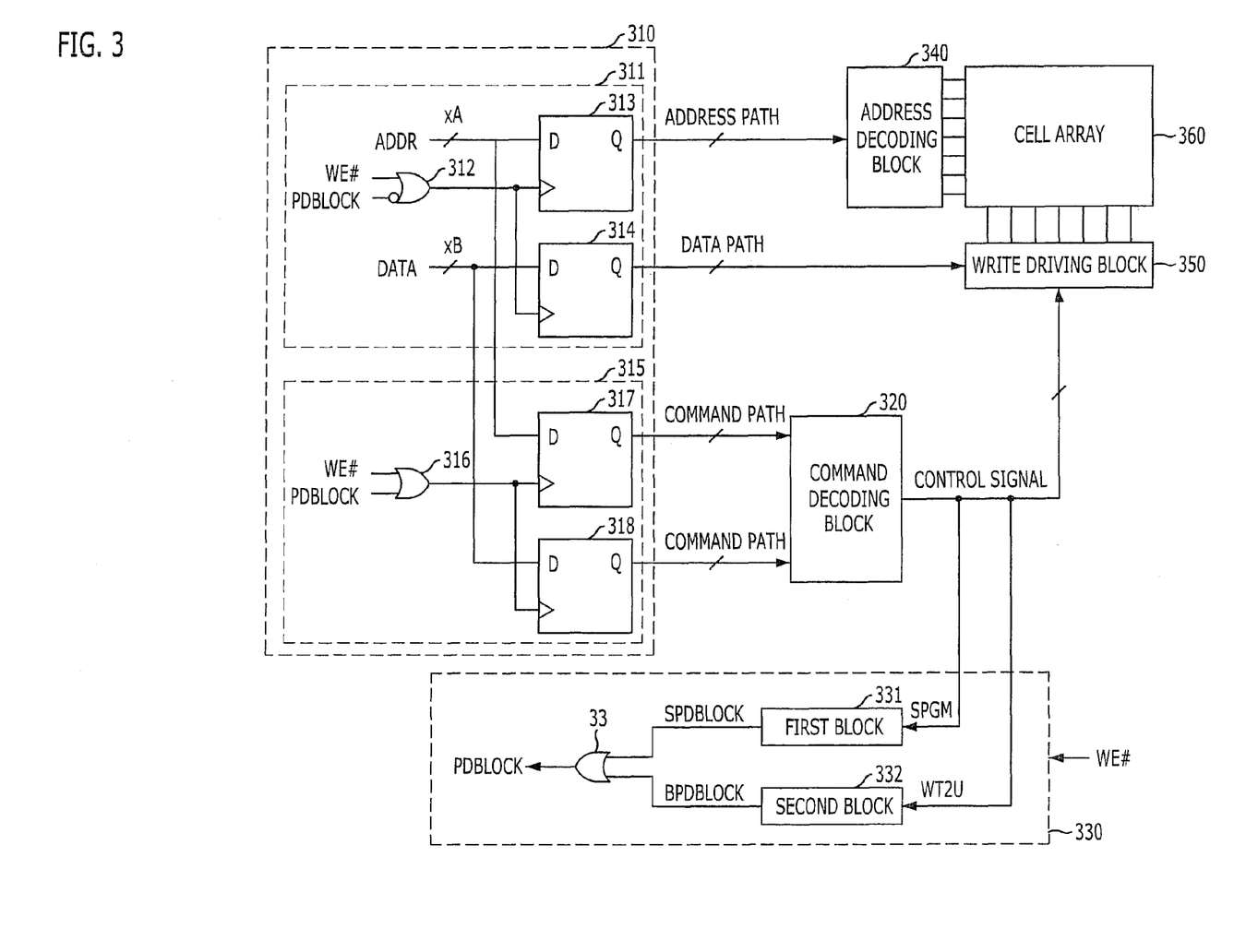
FIG. 3 illustrates a schematic block diagram of a semiconductor memory device in accordance with an embodiment of the present invention.

FIG. 3 illustrates a block diagram of a semiconductor memory device in accordance with an embodiment of the present invention.

Referring to FIG. 3, the semiconductor memory device includes a plurality of input pads ADDR and DATA, a transfer block 310 for transmitting signals inputted through the input pads ADDR and DATA to data information paths ADDRESS PATH and DATA PATH and command paths COMMAND PATH, a command decoding block 320 for decoding signals transmitted through the command paths COMMAND PATH, and a transmission control block 330 for controlling the signal transmission from the transfer block 310 to the command paths COMMAND PATH based on decoding results of the command decoding block 320.

The input pads ADDR and DATA represent pads through which commands and data information are inputted from the outside of a chip. Herein, the data information means information for data to be written (programmed) in the memory device. Therefore, the data information may include data and addresses representing the location of data to be written in the memory device. The present invention is for solving problems occurring as the data information and commands are inputted through the same input pads. In case where it is prescribed that commands are inputted through the address pad ADDR according to the specification of the memory device, the data information may include addresses. In case where it is prescribed that commands are inputted through the data pad DATA, the data information may include data. In case where it is prescribed that commands are inputted through the address pad ADDR and the data pad DATA, the data information may include addresses and data.

The transfer block 310 transmits the signals inputted through the input pads ADDR and DATA to the data information paths ADDRESS PATH and DATA PATH and the command paths COMMAND PATH. Herein, the data information path may include an address path ADDRESS PATH through which addresses are transmitted and a data path DATA PATH through which data are transmitted. In case where it is prescribed that commands are inputted through the address pad ADDR according to the specification of the memory device, the data information path may include the address path ADDRESS PATH. In case where it is prescribed that commands are inputted through the data pad DATA, the data information path may include the data path DATA PATH. In case where it is prescribed that commands are inputted through the address pad ADDR and the data pad DATA, the data information path may include the address path ADDRESS PATH and the data path DATA PATH.

The transfer block 310 includes a first input unit 311 for transmitting the signals inputted through the input pads ADDR and DATA to the data information paths ADDRESS PATH and DATA PATH, and a second input unit 315 for transmitting the signals inputted through the input pads ADDR and DATA to the command information paths COMMAND PATH.

The first input unit 311 includes a D flip-flop 313 for receiving signals inputted through the address pad ADDR as being synchronized with a write enable signal WE#, a D flip-flop 314 for receiving signals inputted through the data pad DATA as being synchronized with the write enable signal WE#, and an OR gate 312 for controlling the write enable signal WE# provided to the D flip-flops 313 and 314 in response to an inverted signal of a block signal PDBLOCK, wherein a bubble at an input node of the OR gate 312 represents that the block signal PDBOLCK is inverted. Herein, although each of the D flip-flops 313 and 314 includes only one flip-flop in FIG. 3, D flip-flops corresponding to the number of address and data pads may be employed in the transfer block 310. According to its operation, the first input unit 311 receives the signals inputted through the address pad ADDR and the data pad DATA as being synchronized with the write enable signal WE# and transmits the received signals to the address path ADDRESS PATH and the data path DATA PATH. However, since the write enable signal WE# inputted to the D flip-flops 313 and 314 cannot toggle if the block signal PDBLOCK is disabled to a logic low, the first input unit 311 cannot receive the signals inputted through the address pad ADDR and the data pad DATA. That is, the first input unit 311 is inactivated when the block signal PDBLOCK is disabled. The block signal PDBLOCK is enabled when the data information, e.g. addresses and data, is inputted to the input pads ADDR and DATA and disabled when commands are inputted through the input pads ADDR and DATA. Therefore, the first input unit 311 operates only during a period where the data information is inputted through the input pads ADDR and DATA.

The second input unit 315 includes a D flip-flop 317 for receiving the signals inputted through the address pad ADDR as being synchronized with the write enable signal WE#, a D flip-flop 318 for receiving the signals inputted through the data pad DATA as being synchronized with the write enable signal WE#, and an OR gate 316 for controlling the write enable signal WE# provided to the D flip-flops 317 and 318 in response to the block signal PDBLOCK. According to its operation, the second input unit 315 receives the signals inputted through the address pad ADDR and the data pad DATA as being synchronized with the write enable signal WE# and transmits the received signals to the command paths COMMAND PATH. However, since the write enable signal WE# inputted to the D flip-flops 317 and 318 cannot toggle if the block signal PDBLOCK is enabled to a logic high, the second input unit 315 cannot receive the signals inputted through the address pad ADDR and the data pad DATA. That is, the second input unit 315 is inactivated when the block signal PDBLOCK is enabled. Therefore, the second input unit 315 operates only during a period where the commands are inputted through the input pads ADDR and DATA.

The command decoding block 320 verifies whether various commands are inputted or not by decoding the signals transmitted to the command paths COMMAND PATH and generates control signals CONTROL SIGNAL to control the semiconductor memory device according to the inputted commands. In FIG. 3, various signals outputted from the command decoding block 320 are illustrated as the control signals CONTROL SIGNAL. In particular, as shown in FIG. 3, a single program signal SPGM and a buffer program signal WT2BU among the control signals CONTROL SIGNAL are inputted to the transmission control block 330.

The transmission control block 330 controls the signal transmission from the transfer block 310 to the command paths COMMAND PATH according to the command decoding results of the command decoding block 320. In detail, if the input of the commands are verified by the command decoding block 320, the transmission control block 330 holds the signal transmission to the command paths COMMAND PATH from the transfer block 310 during a period where the data information corresponding to the inputted commands is inputted. Therefore, the inputting of the data information to the command decoding block 320 is blocked. As a result, it is also prevented that the command decoding block 320 misrecognizes addresses or data as commands. The transmission control block 330 includes a first block 331 to enable a first block signal SPDBLOCK for inactivating the second input unit 315 during one cycle after the inputting of a single program command if the inputting of the single program command is verified, and a second block 332 to enable a second block signal BPDBLOCK for inactivating the second input unit 315 during cycles corresponding to a word count value WC if the inputting of a buffer program command is verified. The first block signal SPDBLOCK and the second block signal BPDBLOCK are inputted to an OR gate 333 and an output signal of the OR gate 333 becomes the block signal PDBLOCK. Therefore, the block signal PDBLOCK is enabled when any one of the first block signal SPDBLOCK and the second block signal BPDBLOCK is enabled.

In accordance with the present invention, if commands are inputted through the input pads ADDR and DATA, the transmission of signals inputted through the input pads ADDR and DATA to the command decoding block 320 is blocked during a period where the data information corresponding to the inputted commands is inputted. Accordingly, it is possible to prevent the mal-operation occurring as the memory device misrecognizes addresses and data as commands.

Although, in FIG. 3, the first input unit 311 is designed to be activated or inactivated in response to the block signal PDBLOCK, the first input unit 311 may be always activated regardless of the block signal PDBLOCK. Only if the second input unit 315 is designed to be activated or inactivated in response to the block signal PDBLOCK, it is possible to prevent the data information inputted through the input pads ADDR and DATA from being misrecognized as commands.

Figure 4:
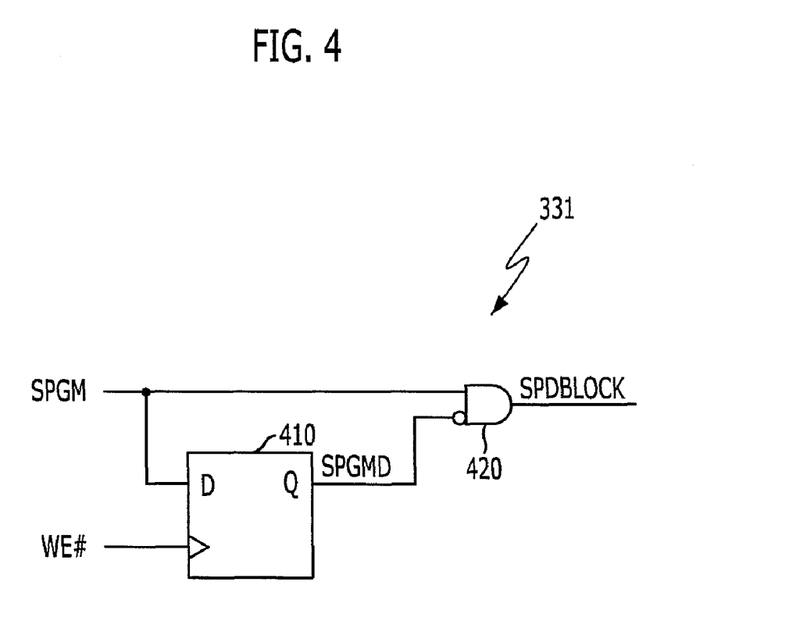
FIG. 4 illustrates a circuit diagram of a first block in FIG. 3 in accordance with an embodiment of the present invention.

FIG. 4 illustrates a circuit diagram of the first block 331 in FIG. 3 in accordance with an embodiment of the present invention.

Referring to FIG. 4, the first block 331 includes a shifting unit 410 for delaying the single program signal SPGM enabled when the single program command is inputted by one cycle, and a signal generating unit 420 for generating the first block signal SPDBLOCK by logically combining the single program signal SPGM and an output signal SPGMD of the shifting unit 410.

When looking through an operation of the first block 331, the single program signal SPGM inputted to the shifting unit 410 is delayed by one cycle on the basis of the write enable signal WE# and then outputted. Subsequently, the signal generating unit 420 enables the first block signal SPDBLOCK during a period where the single program signal SPGM is enabled and the output signal SPGMD of the shifting unit 410 is disabled. Therefore, the first block signal SPDBLOCK is enabled during one cycle after the single program signal SPGM is enabled.

Figure 5:
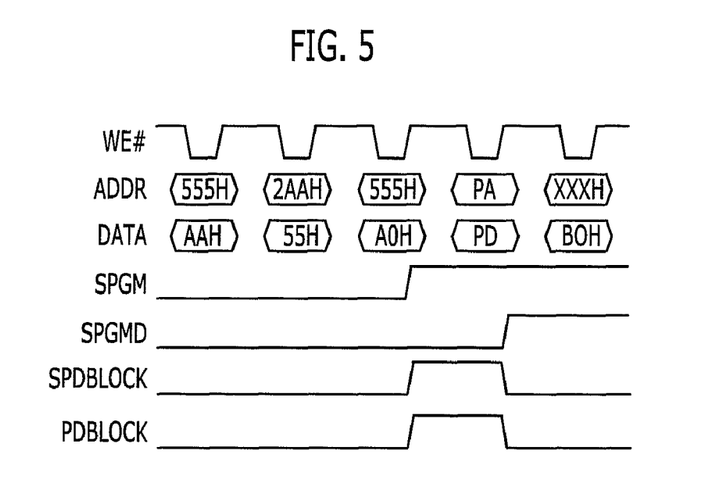
FIG. 5 illustrates a timing diagram for explaining an operation of the first block described in FIG. 4.

FIG. 5 illustrates a timing diagram for explaining the operation of the first block 331 described in FIG. 4.

Referring to FIG. 5, if the single program command is inputted through the input pads ADDR and DATA, the command decoding block 320 recognizes it and enables the single program signal SPGM. The shifting unit 410 shifts the single program signal SPGM by one cycle to output the output signal SPGMD. Then, the signal generating unit 420 enables the first block signal SPDBLOCK to a logic high during a period where the single program signal SPGM has a logic high level and the output signal SPGMD of the shifting unit 410 has a logic low level. The first block signal SPDBLOCK enables the block signal PDBLOCK and the second input unit 315 is inactivated during a period where the block signal PDBLOCK is enabled so that the signals inputted through the input pads ADDR and DATA are not transferred to the command decoding block 320.

During the period where the first block signal SPDBLOCK is enabled, a program address PA and a program data PD are inputted in response to the single program command, and the signals inputted through the address pad ADDR and the data pad DATA are not transferred to the command decoding block 320. Accordingly, there is no possibility to misrecognize the program address PA and the program data PD as commands.

Figure 6:
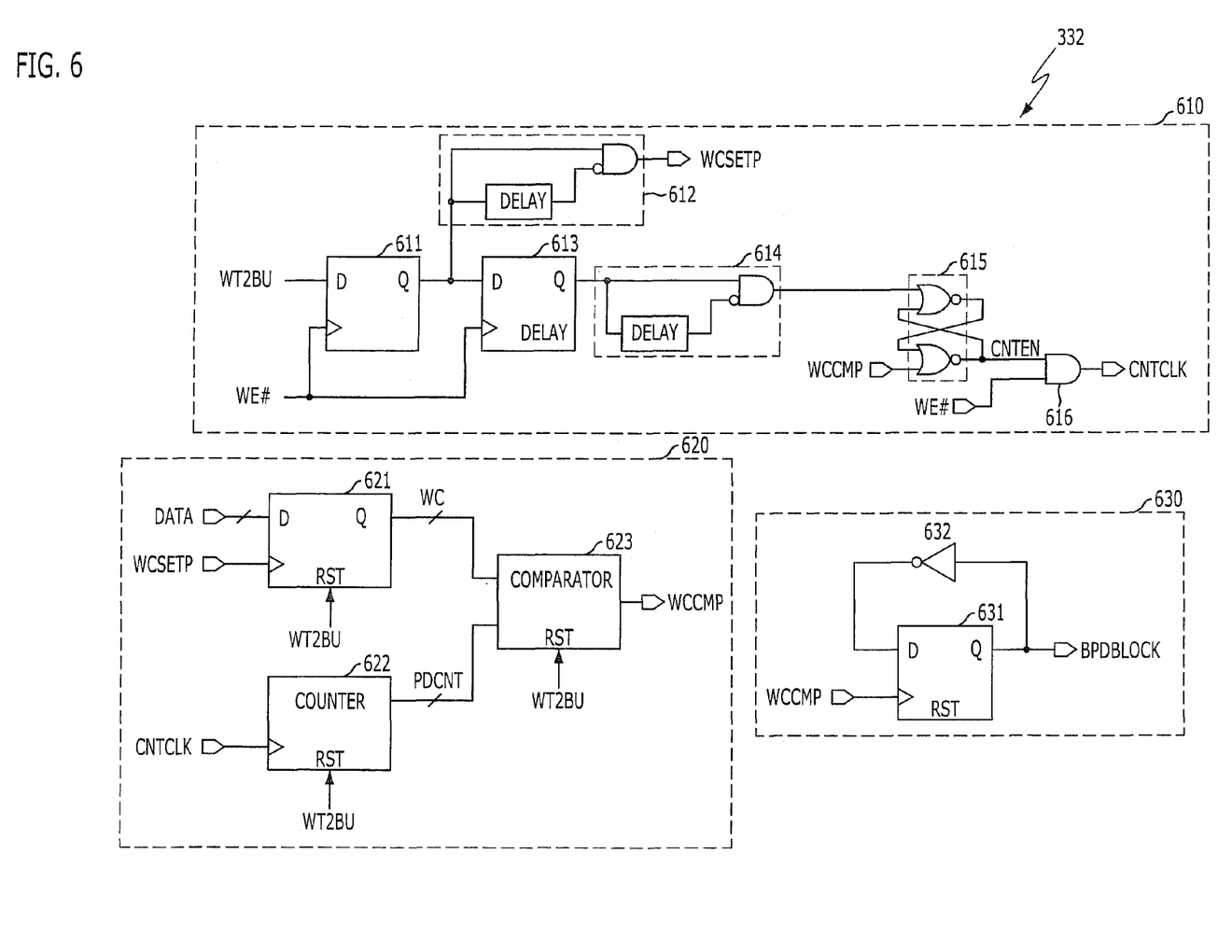
FIG. 6 illustrates a circuit diagram of a second block in FIG. 3 in accordance with an embodiment of the present invention.

FIG. 6 illustrates a circuit diagram of the second block 332 in FIG. 3 in accordance with an embodiment of the present invention.

Referring to FIG. 6, the second block 332 includes a clock control unit 610 for enabling a clock CNTCLK in response to the buffer program signal WT2BU that is enabled if the buffer program command is inputted and disabling the clock CNTCLK in response to a comparison signal WCCMP, a comparison signal generating unit 620 for counting the clock CNTCLK and generating the comparison signal WCCMP representing whether or not a counted code value PDCNT is identical to the inputted word count value WC, and an output unit 630 for enabling or disabling the second block signal BPDBLOCK in response to the comparison signal WCCMP.

The clock control unit 610 includes a first flip-flop 611 for shifting the buffer program signal WT2BU in response to the write enable signal WE#, a first pulse generator 612 for generating a word count input signal WCSETP as a pulse signal in response to an output signal of the first flip-flop 611, a second flip-flop 613 for shifting the output signal of the first flip-flop 611 in response to the write enable signal WE#, a second pulse generator 614 for generating a pulse signal in response to an output signal of the second flip-flop 613, a counting enable signal generator 615 for enabling a counting enable signal CNTEN in response to the pulse signal outputted from the second pulse generator 614 and disabling the counting enable signal CNTEN in response to the comparison signal WCCMP, and a clock generator 616 for outputting the write enable signal WE# as the clock CNTCLK during a period where the counting enable signal CNTEN is enabled.

The comparison signal generating unit 620 includes a word count input element 621 for receiving the word count value WC inputted through the data pad DATA in response to the word count input signal WCSETP, a counter 622 for counting the clock CNTCLK, and a comparator 623 for comparing the word count value WC and an output value PDCNT of the counter 622 and enabling and outputting the comparison signal WCCMP if the word count value WC is identical to the output value PDCNT of the counter 622.

The output unit 630 includes a D flip-flop 631 and an inverter 632 for feeding back an output terminal (Q) signal of the D flip-flop 631 to an input terminal D of the D flip-flop 631. The output unit 630 changes a logic level of the second block signal BPDBLOCK whenever the comparison signal WCCMP is enabled.

Figure 7:
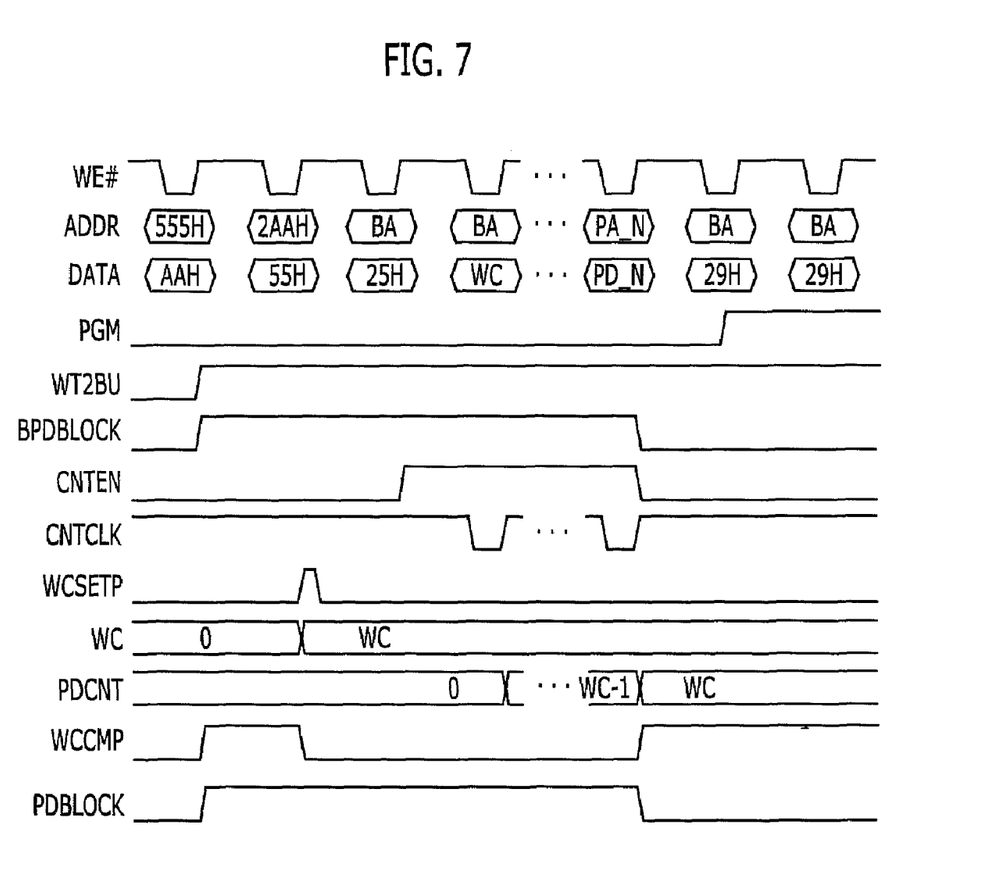
FIG. 7 illustrates a timing diagram for explaining an operation of the second block described in FIG. 6.

FIG. 7 illustrates a timing diagram for explaining an operation of the second block 332 described in FIG. 6.

Referring to FIG. 7, if the buffer program command is inputted through the input pads ADDR and DATA, the command decoding block 320 recognizes the buffer program command and enables the buffer program signal WT2BU. If the buffer program signal WT2BU is enabled, the word count input element 621, the counter 622 and the comparator 623 start to operate at the same time of a reset being released. At that point the reset is released, the output value WC of the word count input element 621 and the output value PDCNT of the counter 622 have the same initial value 0. Accordingly, the comparison signal WCCMP is enabled and the comparison signal WCCMP enables the second block signal BPDBLOCK outputted from the output unit 630.

If one cycle is passed after the buffer program signal WT2BU is enabled, the word count input signal WCSETP is enabled and thus the word count input element 621 receives the word count value WC inputted through the data pad DATA. As a result, the output value WC of the word count input element 621 is not 0 anymore and thus the comparison signal WCCMP is disabled.

If two cycles are passed after the buffer program signal WT2BU is enabled, the counting enable signal CNTEN is enabled. Thus, the clock CNTCLK starts to toggle and the counter 622 starts to perform the counting operation in response to the toggling clock CNTCLK, so that the output value PDCNT gradually increases. If the increasing output value PDCNT of the counter 622 becomes identical to the word count value WC, the comparator 623 enables the comparison signal WCCMP. Then, the comparison signal WCCMP disables the second block signal BPDBLOCK outputted from the output unit 630.

The block signal PDBLOCK is enabled or disabled like the second block signal BPDBLOCK and the signals inputted through the input pads ADDR and DATA are not transferred to the command decoding block 320 during a period where the block signal PDBLOCK is enabled.

When briefly summarizing the whole operation, if the buffer program signal WT2BU is enabled, the second block 332 enables the second block signal BPDBLOCK and, if there is passed a period where program addresses PA_0 to PA_N and program data PD_0 to PD_N as many as the number, i.e., WC+1, corresponding to the word count value WC are inputted, the second block signal BPDBLOCK is disabled. Program addresses PA_0 to PA_N and program data PD_0 to PD_N inputted during a period where the second block signal BPDBLOCK is enabled are not transferred to the command decoding block 320. As a result, there may not be an error where the command decoding block 320 misrecognizes the program addresses PA_0 to PA_N and the program data PD_0 to PD_N as commands.

The operation of the semiconductor memory device in accordance with the present invention will be described referring back to FIGS. 3 to 7 hereinafter.

In accordance with the present invention, the semiconductor memory device including the plurality of input pads ADDR and DATA through which commands and data information are inputted performs operations of recognizing a command by decoding signals inputted through the input pads ADDR and DATA, defining an input period of the data information corresponding to the recognized command, and blocking that signals inputted through the input pads ADDR and DATA during the defined input period are recognized as commands.

The recognizing of the command can be performed by means of the command decoding block 320 decoding signals inputted through the input pads ADDR and DATA and verifying whether a command is inputted or not.

The defining of the input period can be performed by means of the transmission control block 330 generating the block signal PDBLOCK that is enabled during a period where addresses and data corresponding to the recognized command are inputted. In detail, in case the single program command is inputted, the defining of the input period can be performed by enabling the first block signal SPDBLOCK during one cycle after the single program command is inputted. Furthermore, in case the buffer program command is inputted, the defining of the input period can be performed by enabling the second block signal BPDBLOCK during a period corresponding to the word count value WC.

The blocking of the recognition can be performed by blocking the transmission of the signals inputted through the input pads ADDR and DATA to the command paths COMMAND PATH during the block signal PDBLOCK being enabled.

In the semiconductor memory device in accordance with the present invention, if a command is coupled thereto, the memory device prevents signals inputted through input pads from being transmitted to the command decoding block during a period where data information corresponding to the coupled command is inputted thereto. Therefore, the memory device does not misrecognize the data information as commands.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a plurality of input pads;
    a data information path;
    a command path;
    a transfer block configured to transmit signals coupled through the input pads to the data information path and the command path;
    a command decoding block configured to decode signals transmitted through the command path to verify an inputting of a command; and
    a transmission control block configured to generate a control signal for controlling the signal transmission from the transfer block to the command path according to the verified result of the command decoding block.

2. The semiconductor memory device of claim 1, wherein the transmission control block holds the signal transmission from the transfer block to the command path during a period, where data information corresponding to the command is inputted, if the inputting of the command is verified by the command decoding block.

3. The semiconductor memory device of claim 2, wherein the data information path includes an address path.

4. The semiconductor memory device of claim 2, wherein the data information path includes a data path.

5. The semiconductor memory device of claim 2, wherein the data information path includes an address path and a data path.

6. The semiconductor memory device of claim 2, wherein the transfer block includes:
    a first input unit configured to receive the signals coupled through the input pads and transmit the received signals to the data information path; and
    a second input unit configured to receive the signals coupled through the input pads and transmit the received signals to the command path.

7. The semiconductor memory device of claim 6, wherein the transmission control block holds the signal transmission from the transfer block to the command path by inactivating the second input unit.

8. The semiconductor memory device of claim 7, wherein the transmission control block activates the first input unit during a period where the second input unit is inactivated and inactivates the first input unit during a period where the second input unit is activated.

9. The semiconductor memory device of claim 7, wherein the transmission control block is configured to enable a block signal, as the control signal, for inactivating the second input unit during one cycle after the inputting of a single program command if the inputting of the single program command is verified by the command decoding block.

10. The semiconductor memory device of claim 7, wherein the transmission control block is configured to enable a block signal, as the control signal, for inactivating the second input unit during cycles corresponding to a word count value if the inputting of a buffer program command is verified by the command decoding block.

11. The semiconductor memory device of claim 7, wherein the transmission control block includes:
    a first block configured to enable a first block signal, as the control signal, for inactivating the second input unit during one cycle after the inputting of a single program command if the inputting of the single program command is verified by the command decoding block; and
    a second block configured to enable a second block signal, as the control signal, for inactivating the second input unit during cycles corresponding to a word count value if the inputting of a buffer program command is verified by the command decoding block.

12. The semiconductor memory device of claim 11, wherein the first block includes:
    a shifting unit configured to delay a single program signal enabled when the single program command is inputted by one cycle; and
    a signal generating unit configured to generate the first block signal by logically combining the single program signal and an output signal of the shifting unit.

13. The semiconductor memory device of claim 11, wherein the second block includes:
    a clock control unit configured to activate a clock in response to a buffer program signal that is enabled if the buffer program command is inputted and inactivate the clock in response to a comparison signal;
    a comparison signal generating unit configured to count the clock and generate the comparison signal representing whether the counting result is identical to the word count value; and
    an output unit configured to output the second block signal that is enabled or disabled in response to the comparison signal.

14. The semiconductor memory device of claim 13, wherein the clock control unit includes:
    a first flip-flop configured to shift the buffer program signal in response to a write enable signal;
    a first pulse generator configured to generate a word count input signal in response to an output signal of the first flip-flop;

a second flip-flop configured to shift the output signal of the first flip-flop in response to the write enable signal;

a second pulse generator configured to generate a pulse signal in response to an output signal of the second flip-flop;

a counting enable signal generator configured to enable a counting enable signal in response to the pulse signal outputted from the second pulse generator and disable the counting enable signal in response to the comparison signal; and a clock generator configured to output the write enable signal as the clock during a period where the counting enable signal is enabled.

15. The semiconductor memory device of claim 14, wherein the comparison signal generating unit includes:

a word count input element configured to receive the word count value in response to the word count input signal;

a counter configured to count the clock; and a comparator configured to compare the word count value and an output value of the counter and generate the comparison signal.

16. An operating method of a semiconductor memory device including a plurality of input pads through which commands and data information are inputted, the method comprising:

recognizing a command by decoding signals inputted through the input pads;

defining an input period of data information corresponding to the recognized command; and preventing signals inputted through the input pads from being recognized as commands during the defined input period.

17. The operating method of claim 16, wherein the data information includes addresses.

18. The operating method of claim 16, wherein the data information includes data.

19. The operating method of claim 16, wherein the data information includes addresses and data.

20. The operating method of claim 16, wherein the input period of the data information is defined as one cycle when the recognized command is a single program command.

21. The operating method of claim 16, wherein the input period of the data information is defined as cycles corresponding to a word count value when the recognized command is a buffer program command.

* * * * *